United States Patent [19]

Scheib

[11] Patent Number: 4,670,713

[45] Date of Patent: Jun. 2, 1987

[54] TIELINE CONTROL

[75] Inventor: Thomas J. Scheib, Chesterland, Ohio

[73] Assignee: The Babcock & Wilcox Company, New Orleans, La.

[21] Appl. No.: 628,666

[22] Filed: Jul. 6, 1984

[51] Int. Cl.[4] .................. G01R 11/64; G01R 11/00
[52] U.S. Cl. ............................ 324/103 R; 324/132; 324/142; 364/483
[58] Field of Search ............ 324/103 R, 116, 102, 324/142, 132, 76 R; 364/483, 493, 494; 307/38, 39, 64, 68, 87

[56] References Cited

U.S. PATENT DOCUMENTS 4,110,825  8/1978  Fox et al. .................. 324/103 R

Primary Examiner—Ernest F. Karlsen
Attorney, Agent, or Firm—Vytas R. Matas; Robert J. Edwards

[57] ABSTRACT

A method and apparatus of obtaining a correction value for the deviation between an actual power usage and a desired target power usage during a time period, comprises dividing the time period into a plurality of time segments, measuring, after each time segment a fraction of time into each time period, and multiplying the fraction by the target power usage to obtain a value corresponding to the fraction of the total power usage during the cycle. Also after each time segment, the total amount of power which has actually been used is measured and a difference is taken between the total amount power used from the beginning of the period and the fraction of the target power usage from the beginning of the period. This value is then divided by the amount of time remaining in the cycle to obtain the correction value. The correction value can be processed and utilized to control an internal generator for the plant or to take other corrective action.

5 Claims, 2 Drawing Figures

TIELINE CONTROL

FIELD AND BACKGROUND OF THE INVENTION

A Demand Charge for electricity is a billing technique which charges the user based on facility KW-Hrs over a particular time period requirements for plant power rather than the amount of power actually used. If, for example, peak usages in a given period which is typically 30 minutes, is 15 KW (kilowatts) the electricity generating utility must maintain generating capacity at 1.5 KW for the plant whether all this power is actually used or not. A fixed demand window refers to the fact that the demand values calculated for a given time in sequential time periods, with the largest power requirement then being used for billing purposes. Typically, the demand charge will be between 30% and 80% of the total electric bill. Therefore, reducing the demand charge is a cost effective approach in reducing overall production costs.

Special purpose electronics and/or computer systems have been utilized to forecast and control purchased power versus generated power. Many of these systems accomplish this objective by a method known as load shedding.

SUMMARY OF THE INVENTION

According to the present invention, a tieline control is utilized to stabilize the demand for electricity, and thereby reduce demand peaks and their associated high charges. According to the inventive method and apparatus for tieline control, a trajectory is first calculated for purchase power. This trajectory, in turn, is utilized to predict the correction required in internal generation. When no correction is required, the internal generation is maintained at one operator selected base value. The method according to the invention can operate with multiple turbine generators and the apparatus according to the invention can be implemented utilzing distributed microprocessor based control equipment.

Thus, according to the invention, the amount of electricity generated at the plant site is regulated. In applications of the invention, where electricity is not generated, load shedding can be utilized as an alternative.

According to the inventive control strategy, power usage is monitored. The method and apparatus of the invention continuously totals the usage of the period and calculates, based on present usage, the total period power usage. If total usage is above a set limit, purchase power will be reduced. Conversely, if total usage is below the set limit, purchase power will be increased.

According to one example of the invention, it is assumed that a turbine is to be regulated to minimize demand and that electricity generated at a plant is more costly than purchased electricity exact when a new peak demand charge is set. Having these assumed conditions, the control of the invention regulate the turbine so that purchased power does not exceed the demand limit and that generated power is held at a minimum. The actual amount of KW-hour usage for the period is compared to the limit of KW-hour usage for the same time period. Any difference is then the deviation of of power purchased from the desired value. This deviation (or amount of correction required) is divided by the time left within the period to develop a load demand bias to the turbine. By repeating this process several times a second, the target demand continuously compensates for demand changes. Continuously adjusting the target demand focuses the actual usage to "Home In" on target usage throughout the period.

Since any deviation occurring in the last portion of the period could result instabilities in the control action on the turbine, as the time left in a period approaches zero, turbine bias is held constant. Also, during the start of each period, the bias is held constant to allow data to be gathered for the purpose of establishing a trend.

Various mechanisms can be used to control power consumption. The control effect calculated from the target and actual usage values may be used to adjust extraction flow or steam vent flow of a turbine. Another alternative is to use control effect to provide a rational mechanism to introduce selected load shedding which reduces purchased power. Implementation of a demand limit system must be customized for each individual site and its own economic considerations.

While a fixed demand window is generally utilized (for example the minute 30 period) a variable window can also be utilized in with the invention.

Another object of the invention, thus is to provide a method and apparatus of obtaining a correction value for an actual hour usage during a measuring cycle period which comprises selecting a target power usage for the cycle period, dividing the cycle period into a plurality of sequential time segments, after each time segment, measuring a fraction of time that has elapsed in the cycle period, multipyling the fraction by the target power usage to obtain a partial power usage value, measuring the total actual power usage which has been used during the cycle up to the end of each time segment, obtaining the difference between the total actual power usage and the partial target power usage to form a difference value and dividing the difference value by the time remaining in the cycle to form the correction value.

A further object of the invention is to provide an apparatus for exercising the method which is made up of simple function blocks and thus do not require the use of a computer or its associated programming.

A still further object of the invention is to provide an apparatus for tieline control which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodimentof the invention is illustrated.

DESCRIPTION OF THE PREFERRED EMBODIMENT

Figure 1:
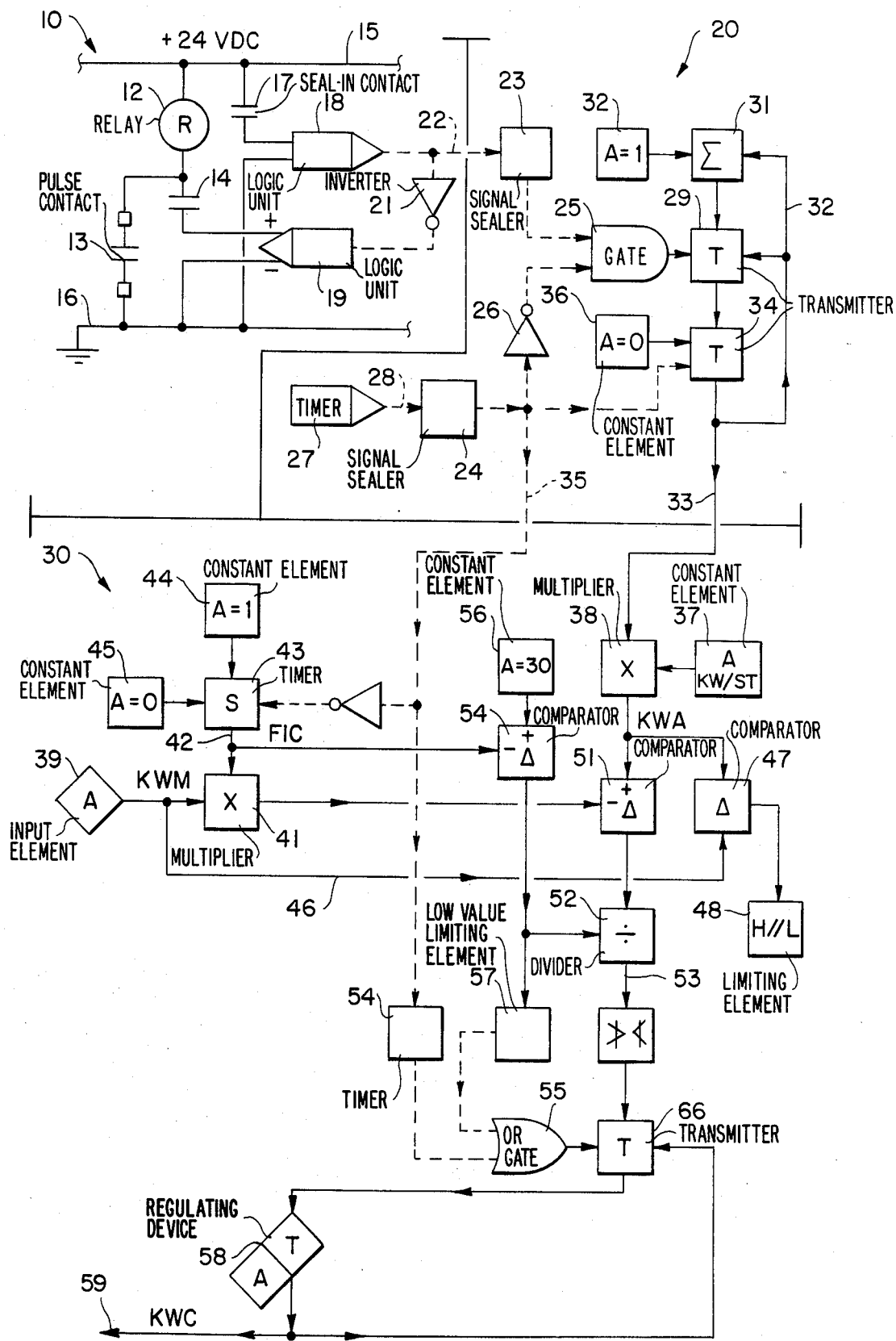
FIG. 1 is a block diagram showing a logic circuit which can be used in accordance with the invention, in conjunction with measuring and timing equipment.

Referring to the drawings in particular, the invention embodied in FIG. 1 comprises a tieline control for generating a correction value which compares the actual amount of power usage to a desired amount of power usage so that the actual amount can be regulated or other appropriate actions can be taken. The circuit of FIG. 1 includes a first section generally designated 10 for holding asynchronous pulses on a 25 volt dc line, so that they can be counted in a counting logic circuit generally designated 20. The third section generally designated 30 contains a timer and logic for calculating the KW correction or correction value needed to bring actual power usage to a target value for the power usage. Section 30 also includes an alarm which is activated if a deviation between the actual and target usage is too high.

Before discussing FIG. 1 in greater detail, it is noted that the algorithim which can be used in accordance with the invention is as follows:

$$KWC = \frac{(KWM)(FIC) - (KWH)}{(CT) - (TIC)}$$

wherein KWC is the power correction value, KWM is the maximum or target usage value in kilowatts-hour, FIC is the fraction of time into each cycle, that is the time elapsed in each cycle, KWH is the power which has been accumulated during each cycle, CT is the total cycle time which is in general 30 minutes, and TIC is the time which has elapsed into the cycle.

The numerator of the algorithim thus calculates the fractional amount of the target power value and from this subtracts the actual amount of used power up to that point in the cycle. The denominator represents the time remaining in the cycle. The cycle period of generally 30 minutes is divided into a plurality of time segments which are generally fractions of a second, and the power correction values calculated after each time segment. As noted above, the correction value is artificially held constant during the beginning and ending portions of the time cycle to avoid instability at these times.

Turning once more to FIG. 1, input section 10 includes a relay 12 which is connected in series with an external input pulse contact 13, across 24 volt dc line 15 and a ground line 16. Pulse contact 13 is for the power (KWH) purchased. A seal in contact 14 latches relay 12 in the energized state when contact 13 is pulsed. A seal-in contact 17 is connected in series from input across logic unit 18 to ground. Logic unit 19 is in a Boolean circuit with an inverter 21. Boolean logic lines are shown as dotted lines while solid lines indicate the passage of an analog signal. The output of circuit 10 is at line 22 and carries pulses which correspond to the amount of KW-Hr actually being used at any point in time. Circuit 20 includes two signal scalers 23 and 24. Signal scaler 23 provides pulses from line 22 to an AND gate 25. The other input of AND gate is connected over an inverter 26 to the output of element 24. Element 24 receives an input irom a timer 27 which impresses on a line 28 a reset pulse at the end of each cycle period. A pulse is thus generated every 30 minutes for example. Upon the generation of this pulse, the inverter 26 inverts the high pulse to a low signal at the output of inverter 26 so the output of AND gate 25 is inhibited.

The output of AND 25 is connected to a transmitter 29 which receives an input from a summing unit 31. Summing unit 31 receives a constant initial input from constant generator 32 and also is connected over a feedback line 33 to the output of a second transmitter 34. Second transmitter 34 is connected to the line 35 which is output from the element 24 and also receives an initial zeroing value from constant element 36. In this way, the number of counts is returned to zero on line 33 after the end of each full cycle.

A constant element 37 in circuit 30 is connected to a multiplier 38 which also receives a number of counts measured from the beginning of each cycle on line 33. Element 37 carries a scaling value which indicates the kilowatts-Hrs per count so that the output of multiplier 38 represents the power accumulated from the beginning of each cycle or KWA for the above shown formula.

The desired maximum power usage KWM is provided at an input 39, to a further multiplier 41 where the desired value is multiplied by a fraction of time (FIC) into each cycle from line 42. The value FIC is measured in a timer 43 which receives an inverted input from line 34 for resetting the timer to zero at the beginning of each cycle, and initial values from constant element 44. The timer can be manually reset by constant element 45 which impresses a zero value in timer 43.

The input element 38 is also connected over a line 46 to a comparator 47 which has another input from multiplier 38. In this way the actual power usage can be compared to the total desired power usage or target power usage after each time segment. If this value represents a difference which is too high, this is sensed by a limiting element 48 which is used as an alarm.

A comparator 51 receives a negative input from multiplier 42 which represents fractional desired KWH-H or power usage accumulated, that is the fraction of the KWH used so are in the cycle, and receives a positive input from multiplier 38 representing the total amount of KWH used thus far in the cycle. The output of comparator 51 represents the present deviation between desired and actual values of the KWH. Divider 52 is utilized to divide this deviation by the time remaining in the cyle to obtain the KWH correction value KWC on line 53.

The time remaining in the cycle is obtained by a comparator 54 which is connected to a constant element 56 which contains a value corresponding to the 30 minutes, and has a negative input connected to line 42 representing the time into the cycle.

The calculated correction value during the first and last portions of each cycle period are held constant by timer 54 which is connected over an OR gate 55 to a transmitter 56. Transmitter 56 is instructed to hold the last correction value if it receives a high signal from OR gate 55. OR gate 55 generates a high signal during the first ten minutes of each cycle by timer 54 and during the last ten minutes of each cycle over a low value limiting element 57 which has an input connected to the comparator 54. The output of transmitter 56 is connected to a regulating device 58 which outputs a usable signal on line 59.

Figure 2:
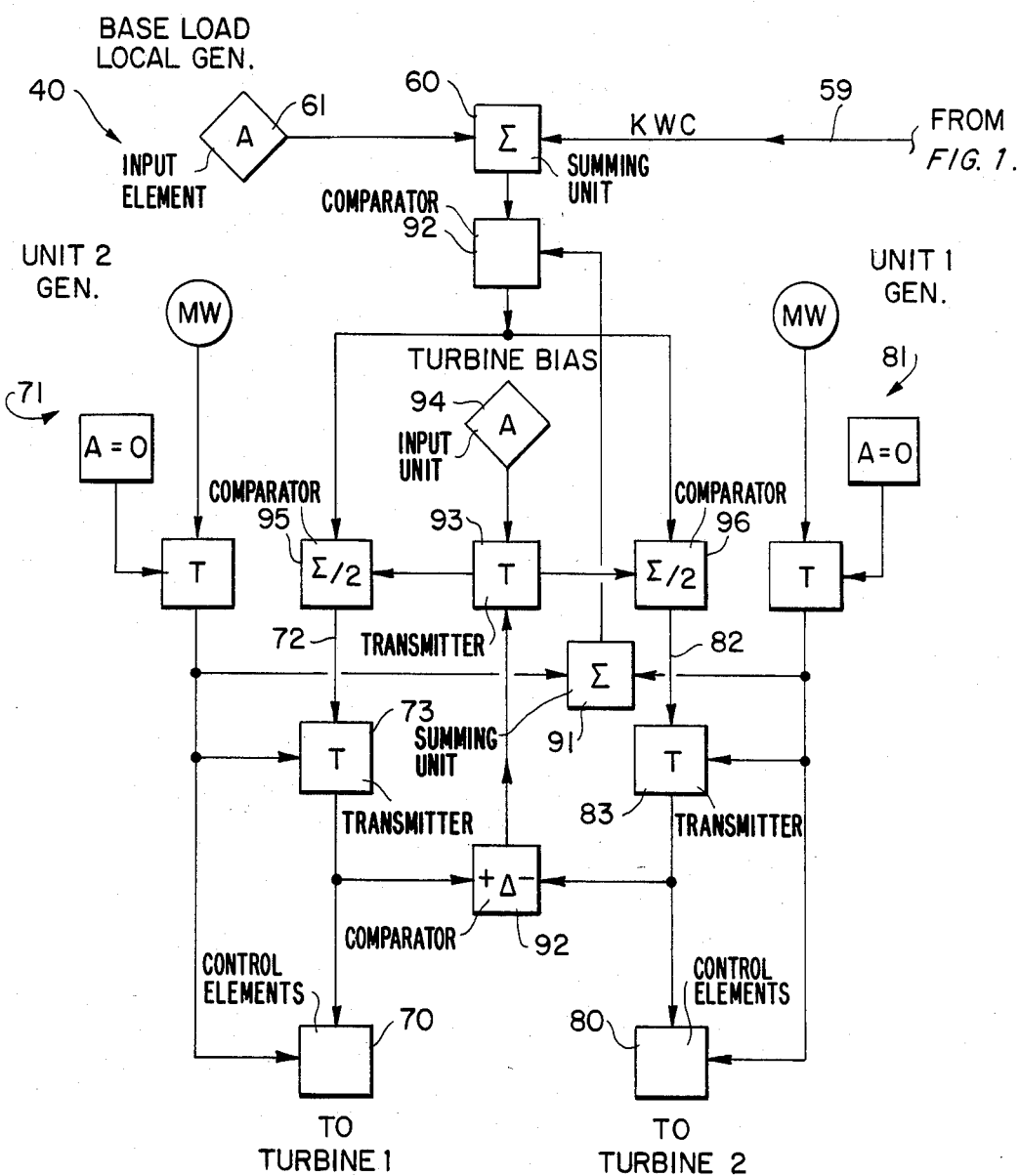
FIG. 2 a block diagram illustrating how the correction value can be utilized to control the operation of the turbine for regulating the actual amount of power generated.

As shown in FIG. 2, the circuit 40 is connected to line 59 and, as indicated above, converts the correction value into a bias signal which can be used to regulate one or more turbines and thus modify the amount of power being generated.

Line 59 is connected to a summing element 60 which receives an initial setting from input element 61 corresponding to the base load for local power generation.

Two control elements 70 and 80 for two turbines are shown which can be regulated in accordance with the correction value. They receive a local control signal from respective circuits 71 and 81 and a remote controlling signal on lines 72 and 82 respectively connected to transmitters 73 and 83 respectively. The total output of the two turbines is measured and summed in a summing unit 91 which has an output connected to a comparator 92. Comparator 92 has another input connected to the summing unit 60 which receives the correction value. To maintain a balance usage of the two generators, a comparator 92 is connected between the outputs of transmitter 73, 83 and feeds a signal back to a further transmitter 93 which also has a turbine bias value provided by an input unit 94. Transmitter 93 outputs values to comparators 95 and 96 which modifies the signals on lines 72 and 82 respectively.

While a specific embodiment of the invention has been shown and described in detail to illustrate the application of the principles of the invention, it will be understood that the invention may be embodied otherwise without departing from such principles.

What is claimed is:

1. A method of obtaining a correction value for actual power usages during a measuring cycle period comprising:
   selecting a target power usage for the cycle period;
   dividing the cycle period into a plurality of sequential time segments;
   measuring, after each time segment, a fraction of measuring cycle that has elapsed in the time period;
   multiplying the fraction, after each time segment, by the target power usage to obtain a partial target power usage value;
   measuring the total actual power usage that has been used during the cycle after each time segment;
   obtaining the difference between the partial target power usage value and the total actual power usage to obtain a difference value after each time segment;
   measuring the time remaining in the cycle after each time segment; and
   dividing the difference value by the time remaining to obtain the correction value.

2. A method according to claim 1, including generating the actual power usage utilizing a generator and controlling the generator according to the correction value so that the actual power usage is modified to approach the target power usage.

3. A device for obtaining a correction value for actual power usage during a measuring cycle period comprising:
   timer means for setting the cycle period at a selected duration;
   cycle time fraction means connected to said timer means for measuring a fraction of the cycle period which has transpired since the beginning of the cycle period;
   time remaining means connected to said timer means for measuring the time remaining in the cycle period;
   power measuring means for measuring actual total power used since the beginning of the cycle period and for the fraction of the cycle period measured by said cycle time fraction means; and
   calculator means connected to said cycle time fraction means, said time remaining means and said power measuring means for calculating the correction value as a function of a desired target power value, said calculating means multiplying the fraction from said cycle means by the target power value to obtain a fraction of the total target value utilized from the beginning of the cycle and taking the difference between the fraction of the target value and the measured power usage.

4. An apparatus according to claim 3, wherein said calculator. means includes a divider for dividing the difference between the fractional target value and the actual measured value by the time remaining in the cycle from said time remaining means.

5. An apparatus according to claim 4, wherein said calculator means comprises a plurality of function blocks for calculating the correction value.

* * * * *

UNITED STATES PATENT AND TRADEMARK OFFICE
CERTIFICATE OF CORRECTION

PATENT NO. : 4,670,713

DATED : Jun. 2, 1987

INVENTOR(S) : Scheib

It is certified that error appears in the above-identified patent and that said Letters Patent is hereby corrected as shown below:

In Col. 1, line 13, delete "1.5" and insert therefor --15--.

In Col. 2, line 22, between "in" and "with" insert therefor --accordance--.

In Col. 3, line 56, delete "irom" and insert therefor --from--.

In Col. 4, line 30, delete "KWH-H" and insert therefor --KW-H--.

Signed and Sealed this

Fourth Day of August, 1992

Attest:

DOUGLAS B. COMER

*Attesting Officer*   *Acting Commissioner of Patents and Trademarks*